US010991377B2

(12) United States Patent
Shanmugam (10) Patent No.: US 10,991,377 B2
(45) Date of Patent: Apr. 27, 2021

(54) METHOD AND SYSTEM FOR SPEAKER LOUDNESS CONTROL (71) Applicant: GOODIX TECHNOLOGY (HK) COMPANY LIMITED, Hong Kong (HK)

(72) Inventor: Gunasekaran Shanmugam, Bangalore (IN)

(73) Assignee: GOODIX TECHNOLOGY (HK) COMPANY LIMITED, Hong Kong (CN)

( * ) Notice: Subject to any disclaimer, the term of this patent is extended or adjusted under 35 U.S.C. 154(b) by 182 days.

(21) Appl. No.: 16/411,311

(22) Filed: May 14, 2019

(65) Prior Publication Data

US 2020/0365167 A1    Nov. 19, 2020

(51) Int. Cl.
*G10L 21/00*         (2013.01)
*G10L 21/0208*       (2013.01)
(Continued)

(52) U.S. Cl.
CPC ........ *G10L 21/0208* (2013.01); *G06F 17/142* (2013.01); *G10L 15/20* (2013.01); *G10L 21/028* (2013.01); *G10L 25/84* (2013.01)

(58) Field of Classification Search
CPC ............................ G10L 21/0208; G06F 17/142
See application file for complete search history.

(56) References Cited

U.S. PATENT DOCUMENTS 5,604,798 A    2/1997   Sacchetti et al.
6,766,176 B1   7/2004   Gupta et al.
(Continued)

FOREIGN PATENT DOCUMENTS

CN    102947878 A     2/2013
WO    2018143979 A1   8/2018
WO    2018174310 A1   9/2018

OTHER PUBLICATIONS

Commend; "Intelligent Volume Control—Sound volume made to measure;" IVC Intelligent Volume Control, Product News Jan. 4, 2015, https://www.commend.com/intercom-news/detail/intelligent-volume-control-sound-volume-made-to-measure.html.

(Continued)

*Primary Examiner* — Ibrahim Siddo
(74) *Attorney, Agent, or Firm* — Scully Scott Murphy & Presser (57) ABSTRACT

A mechanism to adjust far-end signal loudness based on environmental noise levels and device speaker characteristics has a noise-level analyzer that receives feedback from an intelligent speaker-boosting logic circuit that provides a signal to a class-D amplifier to drive the speaker. The noise-level analyzer analyzes near-end environmental noise levels and far-end speech input signal levels across critical frequency bands. The noise-level analyzer performs a masking analysis of the far-end and near-end signals, and guides the speaker-boosting logic circuit to apply determined signal boosting levels over selective bands. The speaker-boosting logic circuit monitors system activity along with the selective band boosting guidance from the noise-level analyzer. Using device speaker information and the speaker excursion pattern, the speaker-boosting logic circuit adjusts far-end speech signal loudness without over excursion of the speaker and damage to the speaker hardware.

20 Claims, 6 Drawing Sheets

(51) Int. Cl.
  *G10L 15/20* (2006.01)
  *G06F 17/14* (2006.01)
  *G10L 25/84* (2013.01)
  *G10L 21/028* (2013.01)

(56) References Cited

U.S. PATENT DOCUMENTS

| | | | |
|---|---|---|---|
| 7,742,746 | B2 | 6/2010 | Xiang et al. |
| 7,869,768 | B1 | 1/2011 | Vishlitzky |
| 8,335,324 | B2 | 12/2012 | Zhang et al. |
| 8,577,047 | B2 | 11/2013 | Gautama |
| 8,798,281 | B2 | 8/2014 | Gautama |
| 8,817,995 | B2 | 8/2014 | Huijser et al. |
| 9,053,697 | B2 | 6/2015 | Park et al. |
| 9,197,181 | B2 | 11/2015 | Thyssen et al. |
| 10,121,491 | B2 | 11/2018 | Ozcan et al. |
| 2004/0176955 | A1 | 9/2004 | Farinelli et al. |
| 2008/0312916 | A1 | 12/2008 | Konchitsky et al. |
| 2009/0147966 | A1 | 6/2009 | McIntosh et al. |
| 2009/0281800 | A1* | 11/2009 | LeBlanc ............. G10L 21/0208 704/224 |
| 2010/0169082 | A1 | 7/2010 | Konchitsky et al. |
| 2011/0054889 | A1 | 3/2011 | Konchitsky et al. |
| 2011/0293103 | A1 | 12/2011 | Park et al. |
| 2012/0257761 | A1 | 10/2012 | Kumar |
| 2012/0263317 | A1 | 10/2012 | Shin et al. |
| 2013/0218560 | A1* | 8/2013 | Hsiao ....................... H03G 3/32 704/233 |
| 2014/0126730 | A1 | 5/2014 | Crawley et al. |
| 2015/0215704 | A1 | 7/2015 | Magrath et al. |
| 2017/0026767 | A1 | 1/2017 | Macours et al. |
| 2017/0140772 | A1 | 5/2017 | Pak et al. |
| 2020/0090675 | A1 | 3/2020 | Sung et al. |

OTHER PUBLICATIONS

NXP Class-D Audio Amplifiers for Portable Devices; https://www.nxp.com/products/media-and-audio/audio-amplifiers/audio-amplifiers-for-portable-devices:MC_71426.

* cited by examiner

FIG. 9

METHOD AND SYSTEM FOR SPEAKER LOUDNESS CONTROL

BACKGROUND

This disclosure relates generally to device speaker loudness control, and more specifically, to a mechanism for selectively enhancing the loudness of a far-end input speech signal audibly provided by a device speaker in response to near-end noise.

Portable voice telephone devices are often used in noisy environments, such as outdoors, near streets, in automobiles, and the like. Successfully engaging in a voice call in such environments can be challenging, especially when the far-end speech signal is not loud enough for the listener to make it out over near-end noise levels. Further complicating this scenario, enhancing the loudness of the far-end speech signal beyond a certain level can cause speaker damage, especially for the small speakers present in many handheld devices.

Some devices provide a speaker-boost protection system whose goal is to enhance the acoustical output of a speaker while limiting speaker membrane excursion and voice coil temperature to levels that will not damage the speaker. Speaker-boost protection systems are intended to ensure that speaker membrane excursion stays within its rated limit. Such speaker-boost protection systems can be used in conjunction with an adaptive loudness control that increases the far-end signal in response to near-end loudness. But systems using such methods often result in decreased intelligibility of the boosted speech signal, especially in environments where the near-end noise levels fluctuate. Further, there may be redundant hardware in the systems to provide this functionality, which results in increased size and power consumption.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism to adjust far-end signal loudness based on environmental noise levels and further based on device speaker characteristics. Embodiments provide this functionality using a noise-level analyzer that receives feedback from an intelligent speaker-boosting logic that, in turn, provides signal to a class-D amplifier to drive the speaker. The noise-level analyzer analyzes near-end environmental noise levels and far-end speech input signal levels across critical frequency bands (i.e., Bark bands). The noise-level analyzer performs a masking analysis of the far-end and near-end signals and guides the intelligent speaker-boosting logic to apply determined signal boosting levels over selective bands. The intelligent speaker-boosting logic monitors system activity (e.g., speaker membrane excursion, speaker temperature, and power levels) along with the selective band boosting guidance from the noise-level analyzer. Using device speaker information and the speaker excursion pattern, the intelligent speaker-boosting block optimizes far-end speech signal loudness without over excursion of the speaker and damage to the speaker hardware.

Figure 1:
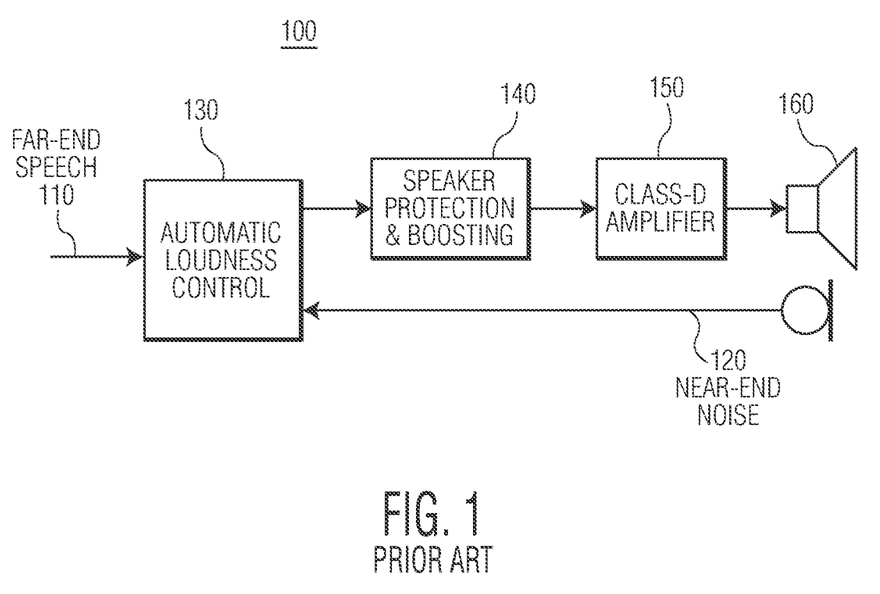
FIG. 1 is a simplified block diagram of a system for increasing far-end speech signal loudness, as provided by conventional devices.

FIG. 1 is a simplified block diagram of a typical system 100 for increasing far-end speech signal loudness, as provided by conventional devices. The existing system 100 incorporates two independent logic blocks: automatic loudness control 130 and speaker protection and boosting 140. Automatic loudness control (ALC) 130 acts on the receive voice chain to enhance speech intelligibility of far-end speech signal 110. The ALC 130 can use a noise estimate to adapt a gain of the received far-end speech signal depending on near-end noise signal 120. The loudness enhanced signal is then provided as an input to speaker protection and boosting 140.

Speaker protection and boosting 140 can adjust the signal using, for example, a speaker-boost protection algorithm that features multi-band compression. The speaker-boost protection algorithm can maximize the acoustical output of the speaker while limiting the membrane excursion and voice coil temperature to safe levels. The speaker-boost protection algorithm can implement an adaptive loudspeaker model that is used to predict extent of membrane excursion. The output sound pressure level is boosted within given mechanical, thermal, and quality limits. Speaker protection and boosting 140 then provides the boosted signal to a class-D amplifier 150 that, in turn, provides the signal to speaker 160.

Figure 2:
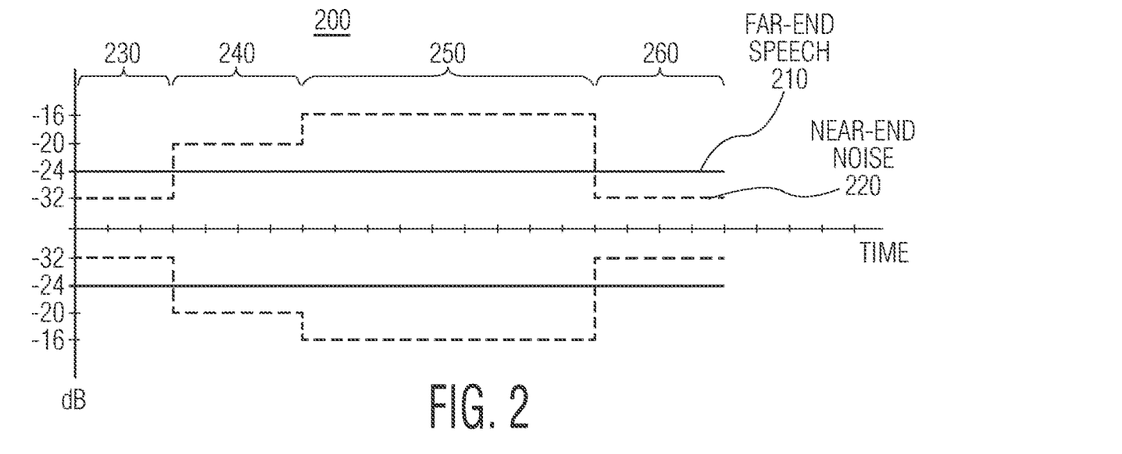
FIG. 2 provides a simplified time vs. loudness chart for an example far-end speech signal of a duration of about 20 seconds.
Figure 3:
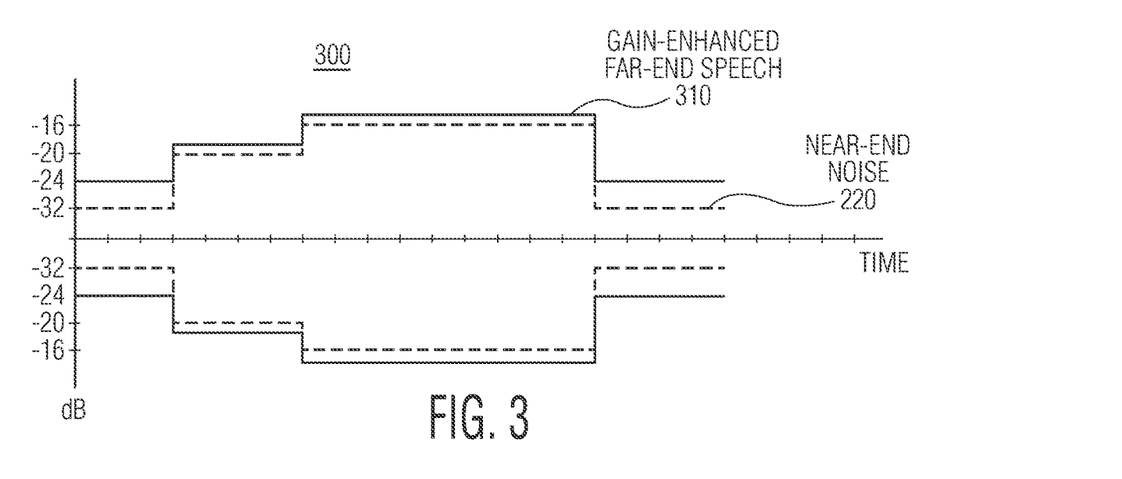
FIG. 3 provides a simplified time vs. loudness chart for an output of an automatic loudness control logic, using the inputs provided in FIG. 2 and generating a gain-enhanced far-end speech signal.
Figure 4:
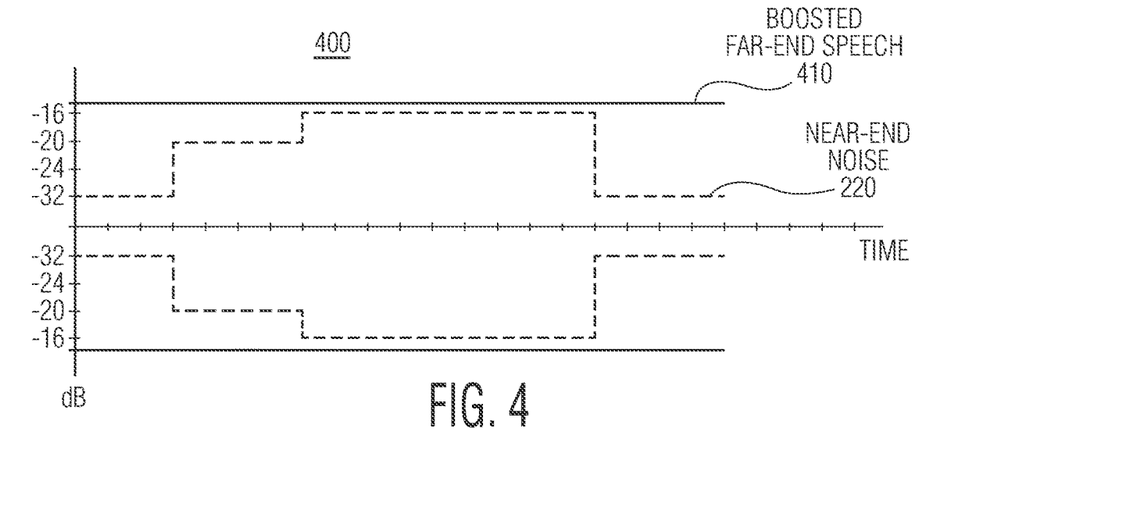
FIG. 4 provides a simplified time vs. loudness chart for an output of a speaker boost logic, using the output of the automatic loudness control logic illustrated in FIG. 3 and generating a boosted far-end speech signal.

Limitations of the above system can be seen in FIGS. 2-4. FIGS. 2-4 provide illustrations of simplified time vs. loudness charts comparing a near-end noise signal (220) with a far-end speech signal 210 (FIG. 2), a gain-enhanced far-end speech signal 310 (FIG. 3), and a boosted far-end speech signal 410 (FIG. 4).

In FIG. 2, a far-end speech signal 210 of a duration of about 20 seconds is provided. The far-end speech signal has a loudness level of −24 dB. A near-end noise signal 220 is also present but has differing loudness levels during the time span. During period 230, the loudness of near-end noise signal 220 is −32 dB, which is lower than the loudness level of the far-end speech signal. During period 240, the loudness of the near-end noise signal is −20 dB, which is higher than the loudness level of the far-end speech signal. During period 250, the loudness of the near-end noise signal is even higher, at −16 dB. Finally, during period 260, the loudness of the near-end noise signal decreases to below that of the far-end speech signal, at −32 dB. For an unadjusted far-end speech signal, during periods 230 and 260, audibility of the far-end speech signal would not be masked by the near-end noise. But during periods 240 and 250, the near-end noise signal would drown out the unadjusted far-end speech signal, making it difficult, if not impossible, for a listener to hear the far-end speech from the speaker.

FIG. 3 provides a simplified time vs. loudness chart for an output of ALC 130 discussed above, using the same inputs provided in FIG. 2 and generating gain-enhanced far-end speech signal 310. Wherever the near-end noise signal loudness level exceeds that of the far-end speech signal (e.g., periods 240 and 250), ALC 130 applies a gain to the far-end signal. But during the low near-end noise loudness level periods (e.g., periods 230 and 260), the far-end signal remains unaltered at the original input level of −24 dB.

FIG. 4 provides a simplified time vs. loudness chart for an output of speaker protection and boosting 140 discussed above, using the output of ALC 130 discussed in FIG. 3 and generating boosted far-end speech signal 410. Speaker protection and boosting 140 enhances the signal by applying boost over the entire period. During periods 230 and 260, speaker protection and boosting significantly boosts the signal, while during period 240 the boost is less. But during period 250, the ALC has already boosted the signal to the threshold of safety due to the high near-end noise level. Therefore, speaker protection and boosting 140 limits the gain on the far-end speech signal in this region (e.g., reducing boost if necessary). The output of speaker protection and boosting 140 can thus lose speech intonation by flattening the output over the entire signal time period, virtually eliminating the loud-to-quiet variation. Embodiments of the present invention are configured to avoid this result.

Figure 5:
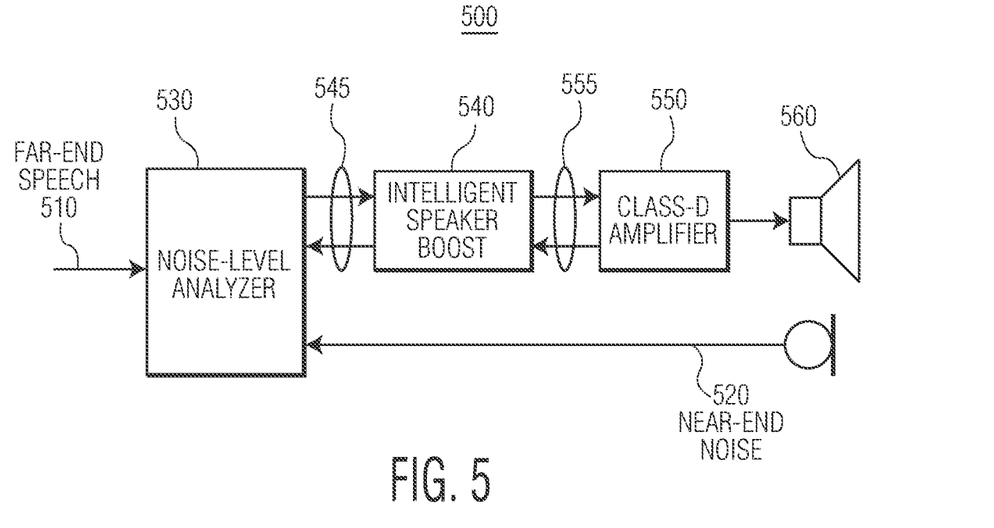
FIG. 5 is a simplified block diagram of a system for increasing far-end speech loudness and intelligibility in response to environmental noise level by selectively boosting certain frequency bands, in accord with embodiments of the present invention.

FIG. 5 is a simplified block diagram of a system 500 for increasing far-end speech loudness and intelligibility in light of environmental noise level by selectively boosting certain frequency bands, in accord with embodiments of the present invention. System 500 receives a far-end speech signal 510 and a near-end noise signal 520 at a noise-level analyzer 530. The noise-level analyzer compares the signal levels across critical bands and communicates with intelligent speaker boost 540 to apply appropriate signal boosting over selective bands. The intelligent speaker boost receives the information from the noise-level analyzer and boosts the signal for speaker 560 prior to sending the signal to amplifier 550. Intelligent speaker boost 540 receives feedback 555 from the amplifier related to speaker performance and power levels in order adjust the amount of boost being provided. In addition, intelligent speaker boost 540 provides feedback and other information 545 to noise level analyzer 530, which can use this information to make adjustments to the recommendations of far-end speech signal boosting.

Figure 7:
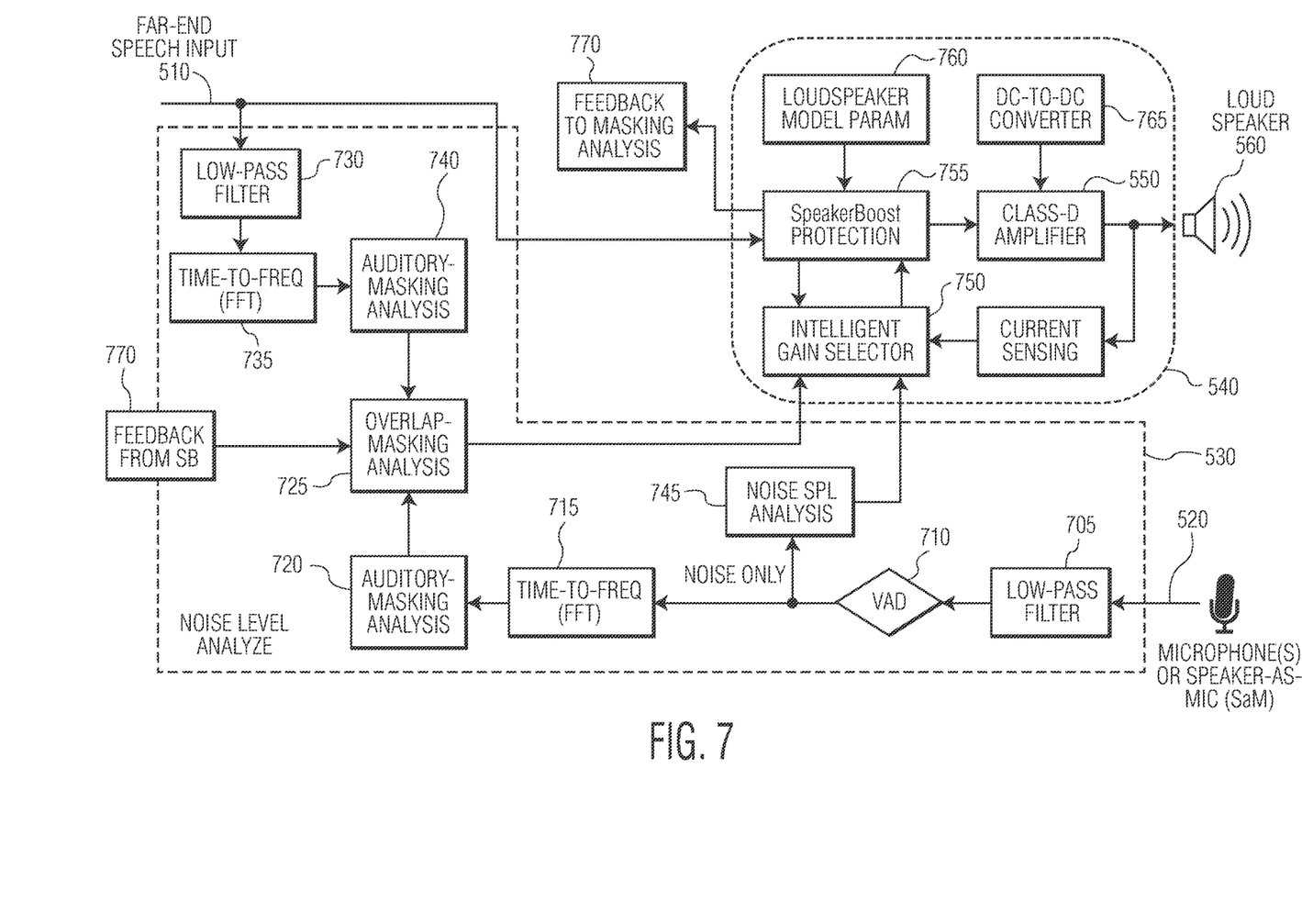
FIG. 7 is a simplified block diagram illustrating details of components of the system illustrated in FIG. 5, in accordance with one embodiment of the present invention.

FIG. 7 is a simplified block diagram illustrating details of components of the system illustrated in FIG. 5. Noise level analyzer 530 receives a near-end noise signal 520 at a low-pass filter 705. Low-pass filter 705 limits the near-end noise signal to a frequency band associated with speech (e.g., 20 Hz to 20 kHz). The signal is provided to a voice activity detector (VAD) 710, which identifies whether there is near-end voice activity. If so, then the near-end noise signal frame is dropped from further analysis so as to not distort any speech-related signal. A fast Fourier transform (FFT) logic 715 then performs a time-to-frequency transformation on the filtered near-end noise signal.

The transformed near-end noise signal is provided to an auditory-masking analysis logic 720. Auditory masking is performed using a psychoacoustic model. In psychoacoustic modeling, empirically determined masking models are used to analyze those frequency components that contribute more to threshold for masking out, in this case, speech frequencies, in this case. For example, the MPEG standard uses two informative psychoacoustic models (i.e., Psychoacoustic Model 1 and 2) to determine a minimum masking threshold for inaudibility. In some embodiments of the present invention, Psychoacoustic Model 1 is utilized, while in others Psychoacoustic Model 2 can be used. For some embodiments, the input to Psychoacoustic Model 1 is a frame of the input signal and the corresponding output is a minimum masking threshold (MMT). The near-end noise MMT is then provided for analysis to Overlap Masking Analysis logic 725.

A similar processing path is provided for far-end speech signal 510 to the noise-level analyzer. The far-end speech signal is provided to low-pass filter 730, which again limits the signal to speech-related frequency bands and is then passed to a fast Fourier transform logic 735 to perform a time-to-frequency transformation. The transformed far-end speech signal is provided to auditory-masking analysis logic 740 to determine the MMT of the far-end speech signal. The far-end speech MMT is provided to Overlap Masking Analysis logic 725.

Overlap Masking Analysis logic 725 compares the far-end speech MMT against the near-end noise MMT using a Bark band-wise comparison. Bark bands in which the speech signal is above an auditory threshold but below the noise-signal MMT are selected to be boosted. A boosting level is determined based on the noise-signal level in the specific Bark band and ensuring that the amplitude of the far-end speech signal is adequately boosted to overcome the near-end noise signal masking the speech signal.

Overlap Masking Analysis logic 725 also receives feedback and other information related to the speaker 770 from intelligent speaker boost 540, which will be discussed below. Feedback 770 can relate to a previous frame and can be used to derive band-wise boosting guidance to maintain uniform boost levels over successive frames.

Noise-level analyzer 530 provides selective band boosting guidance from overlap masking analysis logic 725 along with a computed sound pressure level of the near-end noise from Noise SPL Analysis logic 745 to Intelligent Speaker Boost logic 540. The Intelligent Speaker Boost logic also receives feedback from class-D amplifier 550 so that speaker activity (e.g., membrane excursion and coil temperature) can be monitored. Intelligent Speaker Boost logic 540 is also provided with device speaker characteristics and speaker excursion patterns as part of loudspeaker model parameters 760, which are stored in an associated memory. Based on the selective band boosting guidance and near-end noise sound pressure level, loudness for far-end speech input 510 for the selected critical bands is maximized by intelligent signal gain selector 750 to a level that will not cause over-excursion of the speaker membrane and physical damage to the speaker hardware.

Embodiments of intelligent signal gain selector 750 can utilize information such as present speaker coil temperature, loudspeaker model characteristics 760 (e.g., resonant frequency of speaker, maximum membrane excursion, and the like), previous frame output of the speaker boost logic, battery power level, along with the selective band boosting guidance from noise-level analyzer 530 and ambient noise level to determine how much increase in loudness is desirable. Embodiments can find a minimum of speaker boost generated gain level and noise-level analyzer gain per each Bark band. If a low battery is indicated, then signal gain can avoid applying gain at higher frequencies (e.g., above 8 kHz), hence ensuring no audible speech quality degradation but still saving battery power. Embodiments of the intelligent signal gain selector can compute signal energy at bands such as 4-8 kHz, 8-16 kHz, and 16-24 kHz (e.g., at a 48 kHz sampling frequency). The frequency bands at noise floor and having no speech tonal components will not have gain applied. If a Bark band has an ambient noise masking a far-end speech component, but still cannot have additional gain applied (e.g., due to speaker state limitations), gain will not be applied to that Bark band, thus avoiding gain that will make no perceptual difference and saving battery power.

After combining gain levels from speaker boost and the noise-level analyzer, embodiments can smooth combined gain over successive frames (e.g., for 1-2 seconds) to avoid volume fluctuations during transient noise. Some or all of the above information also can be provided, along with current frame information, as feedback 770 to the noise-level analyzer.

Figure 8:
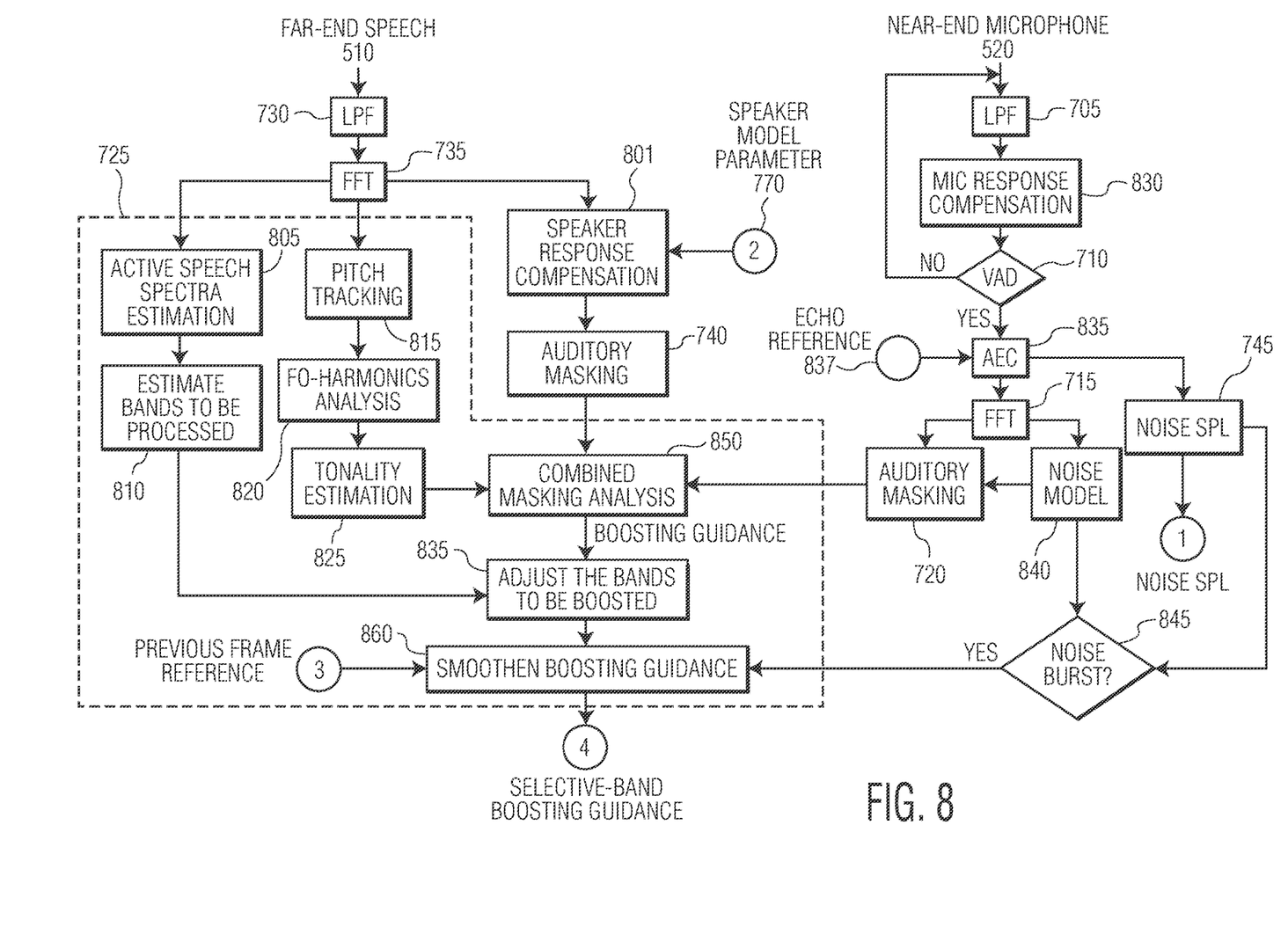
FIG. 8 is a simplified block diagram illustrating an example of a flow for a noise-level analyzer 530, in accordance with one embodiment of the present invention.

FIG. 8 is a simplified block diagram illustrating an example of a flow for a noise-level analyzer 530, in accord with one embodiment of the present invention. Preprocessing of far-end speech signal 510 is performed, first by low-pass filtering (730), which limits the bands between 20 Hz and 20 kHz. A time-to-frequency transformation is performed using fast Fourier transform (735). A speaker response compensation can be performed (801) to adjust the far-end speech signal in light of a loudspeaker hardware response model also used during speaker boost protection. Auditory masking (740), using psychoacoustic analysis, is performed to determine a minimum masking threshold (MMT) for the far-end speech signal.

Preprocessing of near-end noise signal 520 is also performed, first by a low-pass filter 705, again to limit the bands between 20 Hz and 20 kHz. A microphone response compensation is performed (830), to adjust for the type of microphone being used to input the near-end noise signal to the system. Voice-activity detection is then performed (710) to identify any near-end voice activity. If there is near-end voice activity, then the near-end noise input signal frame is dropped from further analysis. Acoustic echo cancellation can be performed on the near-end noise signal to reduce any echo signal captured by the near-end noise microphone (835). In order to perform an echo cancellation, embodiments use an echo reference signal 837 as an additional input. A time-to-frequency transformation of the acoustic echo cancellation signal is performed using fast Fourier transform (715), and then auditory masking is performed (720) to determine the MMT of the near-end noise signal. Auditory masking can use, as an input, information from a noise model 840, which estimates an average noise spectrum over time. This allows discrimination of a noise burst from a constant ambient noise (845) and can be used to smoothen boosting guidance from auditory masking during periods of far-end speech.

After the far-end speech signal is transformed by fast Fourier transform (735), additional core analysis can be performed on the far-end speech signal. Embodiments of the present invention can provide processing such as active speech spectra estimation (805), in which an analysis is conducted of the input signal spectrum and an estimate of the active speech spectrum is determined using energy levels across Bark bands and a level history from previous far-end speech frames. From the estimated active speech spectrum, a determination of the bands to be further processed is performed (810), restricting the speech spectrum into an active band (e.g., 20 Hz-4 kHz, 20 Hz-8 kHz, 20 Hz-16 kHz, or a full spectrum of 20 Hz-20 kHz). The determined active band is then provided for adjustment of the bands to be boosted (835), to be discussed in greater detail below.

The transformed far-end speech signal from FFT 735 can also be analyzed for pitch tracking (815). The voiced regions of the far-end speech signal are analyzed to estimate the fundamental frequency (f0) of the speech signal. In one embodiment, F0 estimation is performed using a cepstrum analysis of the periodic waveform produced by the transformed far-end speech signal. A fundamental frequency harmonics analysis (820) can be performed to avoid a false f0 detection in the signal. If the input signal is identified to have a true fundamental frequency (e.g., a pitched signal), a tonality estimation can be performed (825) to help identify tonal maskers. The tonal maskers can then be provided for combined masking analysis (850), along with the far-end speech MMT (from 740) and the near-end noise MMT (from 720). As discussed above, the far-end speech MMT and near-end noise MMT are compared, and the bands in which the far-end speech signal is above the auditory threshold from the tonal maskers, and which are below the near-end noise MMT, will be identified for boosting guidance.

The boosting guidance is adjusted in light of the estimated bands to be processed (810) and the gain levels for a noise floor are retained to avoid boosting at the noise floor (855). The adjusted boosting guidance can then be smoothed across several frames (860) using information from noise burst identification (from 845) to generate selective band-boosting guidance. This smoothing is also performed in light of a previous sound frame output signal reference from intelligent speaker boost 540. The selective band-boosting guidance is then provided to intelligent signal gain selector 750.

Figure 9:
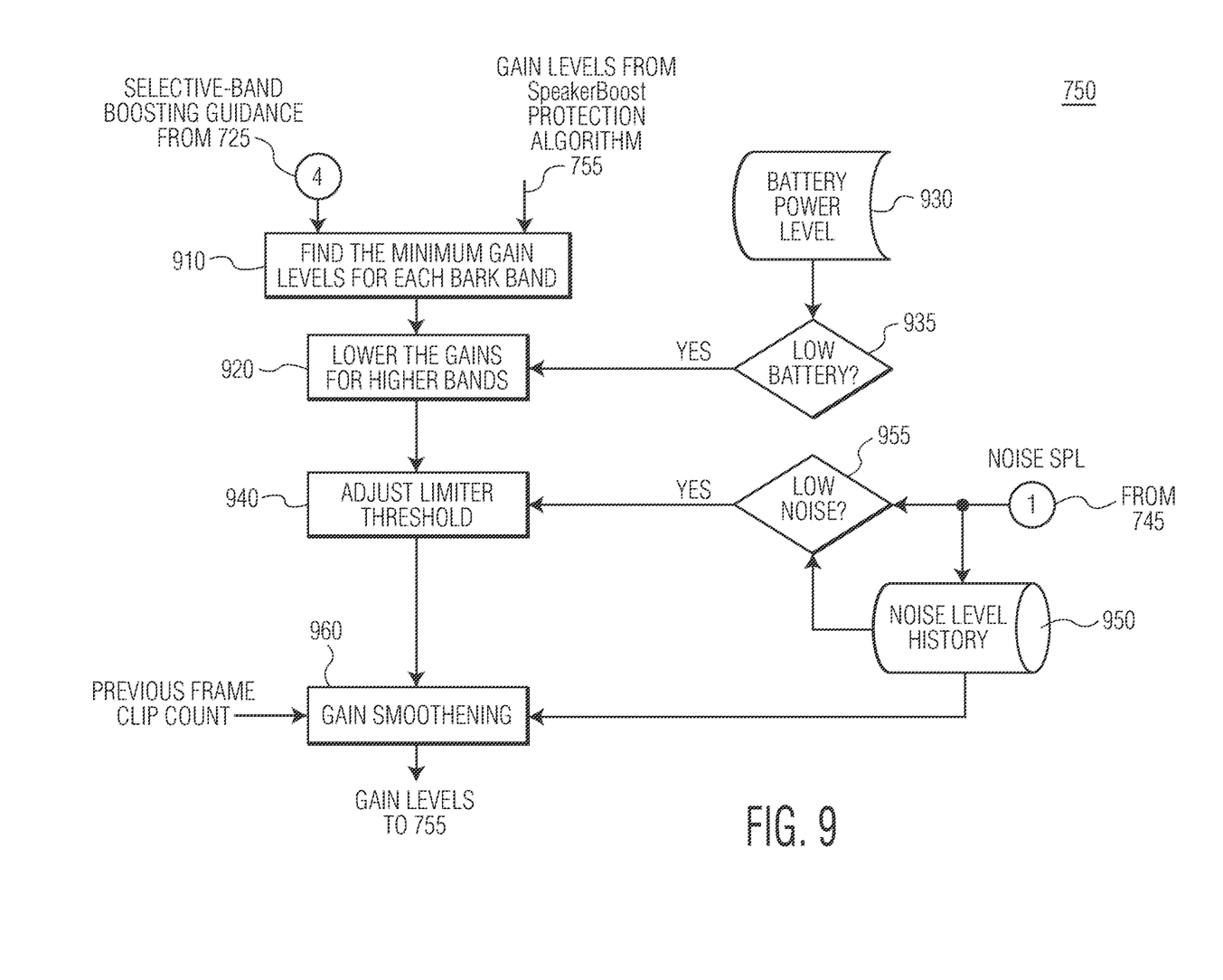
FIG. 9 is a simplified flow chart illustrating an example of a flow for intelligent signal gain selector that is part of the intelligent speaker boost, in accordance with one embodiment of the present invention.

FIG. 9 is a simplified flow chart illustrating an example of a flow for intelligent signal gain selector 750 that is part of the intelligent speaker boost 540, in accord with one embodiment of the present invention. As discussed above, intelligent signal gain selector 750 receives the selective band-boosting guidance from noise-level analyzer 530. In addition, intelligent signal gain selector 750 receives gain levels provided from speaker boost protection logic 755. These two input gain parameters are then analyzed for the minimum gain levels for each Bark band (910). A determination is made as to whether battery-power level 930 is low (935). If so, then the gain is lowered for higher Bark bands (e.g., bands above 4 kHz selected based on need) (920). By reducing the gain on the higher bands, the speech spectra clarity is retained while helping to reduce batter power consumption.

Another input to intelligent signal gain selector 750 is an output from noise signal pressure level analysis logic 745. Through a comparison between the present noise signal pressure level and a history of noise level signals (950), a determination is made as to whether the present near-end noise signal is a quiet environment with low noise (955). If the current environment is quiet, then the limiter threshold can be adjusted to lower applied output gain (940). Finally, gain smoothening (960) can be performed to better ensure a smooth transition of loudness levels across frames. This can take a feedback signal from a previous frame clip count and lowers the gain if the clipping from the previous frame exceeds a predetermined threshold. The smoothed gain levels are then provided to speaker boost protection logic 755 to be applied to the far-end speech input signal, as discussed above with regard to FIG. 7.

Figure 6:
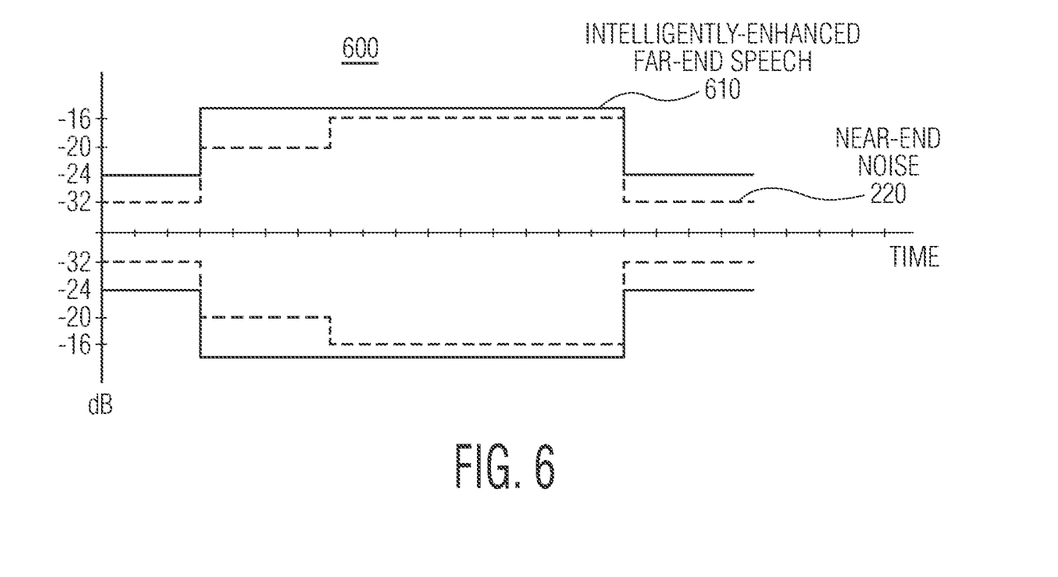
FIG. 6 provides a simplified time vs. loudness chart for an output of an intelligent speaker boost system in accord with embodiments of the present invention, using the example signal inputs discussed above with respect to FIG. 2.

FIG. 6 provides a simplified time vs. loudness chart for an output of the intelligent speaker boost system of embodiments of the present invention as discussed above, using the signal inputs discussed above with respect to FIG. 2. During periods 230 and 260, the far-end speech signal is not boosted, as the near-end noise level during those periods is not masking the speech. This has an advantage of retaining speech intonation and conserving average battery power consumed by speaker 560. During periods 240 and 250, the system boosts the far-end speech signal above the near-end noise signal levels, as required, to maintain audibility of the far-end speech as provided by the loudspeaker.

By now it should be appreciated that there has been provided a system for providing audio of far-end speech in the presence of near-end noise. The system includes a microphone, a speaker, a noise-level analyzer, and intelligent speaker boost logic. The microphone is configured to capture the near-end noise and generate a near-end noise signal associated with the near-end noise. The speaker is configured to generate an audible sound in response to the far-end speech. The noise-level analyzer is coupled to the microphone and is configured to receive feedback information from the intelligent speaker boost logic, determine masking across frequency bands of a far-end speech signal by the near-end noise signal where the far-end speech signal is associated with the far-end speech, determine selective band boosting guidance using the masking and the feedback information, and provide the selective band boosting guidance to the intelligent speaker boost logic. The intelligent speaker boost logic is coupled to the noise-level analyzer, and is configured to monitor speaker activity, boost loudness of the far-end speech signal in response to one or more of the selective band boosting guidance, near-end sound pressure level, speaker activity, a power level of the system, and speaker characteristics stored in a memory associated with the intelligent speaker boost logic.

In one aspect of the above embodiment, the noise-level analyzer further includes far-end speech preprocessing logic configured to process the far-end speech signal prior to determining the masking, and near-end noise signal preprocessing logic configured to process the near-end speech signal prior to determining the masking. In a further aspect, the far-end speech signal preprocessing logic further includes: low-pass filter logic, fast Fourier transform logic, speaker response compensation logic, and far-end speech auditory masking logic. The low-pass filter logic is configured to limit the far-end speech signal to frequencies associated with speech. The fast Fourier transform logic is configured to perform a time-to-frequency transformation of the low-pass filtered far-end speech signal. The speaker response compensation logic is configured to adjust the transformed far-end speech signal using information associated with the speaker. The far-end speech auditory masking logic is configured to determine a minimum masking threshold (MMT) for the adjusted far-end speech signal. In yet a further aspect, the noise-level analyzer further includes: pitch tracking logic, fundamental frequency analysis logic, and tonal-masking logic. The pitch tracking logic is configured to estimate a fundamental frequency of the transformed far-end speech signal. The fundamental frequency analysis logic is configured to determine whether the estimated fundamental frequency is a false fundamental frequency. The tonal masking logic is configured to identify tonal maskers associated with the far-end speech signal's identified fundamental frequency.

In still a further aspect, the masking across frequency bands is further determined using the identified tonal maskers. In another aspect, the noise-level analyzer further includes active speech spectra estimation logic and speech band selection logic. The active speech spectra estimation logic is configured to estimate an active speech spectrum of the transformed far-end speech signal using energy levels across Bark bands and previous spectrum levels. The speech band selection logic is configured to select an active band from the estimated active speech spectrum. In a further aspect, determining the selective band boosting guidance is further performed using the selected active band. In another aspect, the information associated with the speaker is derived from stored speaker model parameters.

In another aspect of the above embodiment, the near-end noise speech signal preprocessing logic includes low-pass filter logic, microphone response compensation logic, voice-activity detection logic, acoustic echo cancellation logic, fast Fourier transform logic, and near-end noise auditory masking logic. The low-pass filter logic is configured to limit the near-end noise signal to frequencies associated with speech. The microphone response compensation logic is configured to adjust the filtered near-end noise signal using information associated with the microphone. The voice-activity detection logic is configured to identify any near-end voice activity in the adjusted near-end noise signal. The acoustic echo cancellation logic is configured to reduce an echo signal captured by the microphone in the voice cancelled near-end noise signal. The fast Fourier transform logic is configured to perform a time-to-frequency transformation of the echo-reduced near-end noise signal. The near-end noise auditory masking logic is configured to determine a MMT for the transformed near-end noise signal. In a further aspect, the information associated with the microphone is derived from stored microphone model parameters.

In another aspect of the above embodiment, the noise-level analyzer performs the determining the masking across frequency bands of the far-end speech signal by the near-end noise signal by being configured to: generate a MMT of the far-end speech signal using a psychoacoustic model, generate a MMT of the near-end noise using the psychoacoustic model, compare the far-end speech MMT against the near-end noise MMT using a Bark band-wise comparison, and determine masking occurs in Bark bands where the far-end speech MMT is above an auditory threshold and below the near-end noise MMT. In another aspect of the above embodiment, the noise-level analyzer performs the determine selective band boosting guidance using the masking and the feedback information by being configured to: identify for boosting one or more frequency bands in which the far-end speech signal is above an auditory threshold and masked by the near-end noise signal, estimate an active speech spectrum by analyzing far-end speech signal energy levels across Bark bands and a history of energy levels of the far-end speech signal, and restrict the boosting to the estimated active speech spectrum. In a further aspect, the noise-level analyzer performs the determining selective band boosting guidance using the masking and feedback information by being further configured to smooth the band boosting guidance across frames using noise burst information and previous frame band boosting guidance.

In yet another aspect of the above embodiment, the intelligent speaker boost logic further includes intelligent signal gain logic, which is configured to: determine minimum gain levels for each Bark band by analyzing the selective band boosting guidance and gain levels from the speaker activity, lower the minimum gain levels for selected high Bark bands in response to a determination that the power level of the system is low, and lower the minimum gain levels in response to a determination that near-end sound pressure levels are low. In a further aspect, the intelligent signal gain selector logic is further configured to adjust minimum gain levels using information from a previous speaker output signal.

Another embodiment of the present invention is a method for providing audio of far-end speech in the presence of near-end noise using a speaker. The method includes determining masking across frequency bands of a far-end speech signal by a near-end noise signal, determining selective band boosting guidance using the masking determination and feedback information from the speaker, and boosting loudness of the far-end speech signal in response to the selective band boosting guidance and information regarding a system including the speaker.

In one aspect of the above embodiment, determining the masking across frequency bands of the far-end speech signal by the near-end noise signal includes determining a far-end speech MMT, determining a near-end noise MMT, and comparing the far-end speech MMT with the near-end noise MMT to find masked far-end speech frequency bands where the far-end speech MMT is below the near-end noise MMT. In a further aspect, determining the far-end speech MMT includes filtering the far-end speech signal to limit frequencies of the far-end speech signal to a range associated with human speech, performing a time-to-frequency transformation of the filtered far-end speech signal, adjusting the transformed far-end speech signal in response to characteristics of the speaker, and performing a psychoacoustic analysis on the adjusted far-end speech signal to determine the far-end speech MMT. In another further aspect, determining the near-end noise MMT includes filtering the near-end noise signal to limit frequencies of the near-end noise signal to a range associated with human speech, adjusting the filtered near-end noise signal in response to characteristics of a microphone used to generate the near-end noise signal, drop a near-end noise signal having any detected voice-activity, performing a time-to-frequency transformation of the adjusted near-end noise signal, and performing a psychoacoustic analysis on the transformed near-end noise signal to determine the near-end noise MMT. In a still further aspect, determining the near-end noise MMT further includes performing an acoustic echo cancellation on the near-end noise signal.

In another aspect, determining the masking across frequency bands of the far-end speech signal by the near-end noise signal further include: determining a fundamental frequency of the transformed far-end speech signal, identifying tonal maskers using a tonality estimation of the far-end speech signal, and identifying those far-end speech frequency bands that are above an auditory threshold using the tonal maskers. In a further aspect, determining selective band boosting guidance includes: selecting far-end frequency bands to boost based on those far-end speech frequency bands where the far-end speech MMT is below the near-end noise MMT and the identified far-end speech frequency bands that are above the auditory threshold; analyzing far-end speech signal energy levels across Bark bands and a history of energy levels of the far-end speech signal to estimate an active speech spectrum; limiting the far-end frequency bands to boost based on the estimated active speech spectrum; and smoothing the limited far-end frequency bands to boost in light of a noise burst identification and a previous speaker output signal frame.

In another aspect of the above embodiment, boosting loudness of the far-end speech signal in response to the selective band boosting guidance and information regarding the system including the speaker includes: determining minimum gain levels for each Bark band by analyzing the selective band boosting guidance and gain levels from the speaker activity; adjusting the minimum gain levels for selected high Bark bands in response to determining that the power level of the system is low; adjusting the minimum gain levels in response to a determination that near-end sound pressure levels are low; and adjusting the minimum gain levels using information from a previous speaker output signal frame.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 7 and the discussion thereof describe an exemplary signal processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A system for providing audio of far-end speech in the presence of near-end noise, the system comprising:
    a microphone configured to capture the near-end noise and generate a near-end noise signal associated with the near-end noise;
    a speaker configured to generate an audible sound in response to the far-end speech;
    a noise-level analyzer, coupled to the microphone, and configured to:
        receive feedback information from a speaker boost logic circuit,
        determine masking across frequency bands of a far-end speech signal by the near-end noise signal wherein the far-end speech signal is associated with the far-end speech,
        determine selective band boosting guidance using the masking and the feedback information, and
        provide the selective band boosting guidance to the speaker boost logic circuit; and
    wherein the speaker boost logic circuit is coupled to the noise-level analyzer, and configured to:
    monitor speaker activity, and
    boost loudness of the far-end speech signal in response to one or more of the selective band boosting guidance, near-end sound pressure level, the speaker activity, a power level of the system, and speaker characteristics stored in a memory associated with the speaker boost logic circuit.

2. The system of claim 1, wherein the noise-level analyzer further comprises:
    far-end speech signal preprocessing logic configured to process the far-end speech signal prior to said determining the masking; and
    near-end noise signal preprocessing logic configured to process the near-end speech signal prior to said determining the masking.

3. The system of claim 2, wherein the far-end speech signal preprocessing logic further comprises:
    low-pass filter logic configured to limit the far-end speech signal to frequencies associated with speech;
    fast Fourier transform logic configured to perform a time-to-frequency transformation of the low-pass filtered far-end speech signal;
    speaker response compensation logic configured to adjust the transformed far-end speech signal using information associated with the speaker; and
    far-end speech auditory masking logic configured to determine a minimum masking threshold (MMT) for the adjusted far-end speech signal.

4. The system of claim 3, wherein the noise-level analyzer further comprises:
    pitch tracking logic configured to estimate a fundamental frequency of the transformed far-end speech signal;
    fundamental frequency analysis logic configured to determine whether the estimated fundamental frequency is a false fundamental frequency; and
    tonal masking logic configured to identify tonal maskers associated with the far-end speech signal's identified fundamental frequency.

5. The system of claim 3, wherein the noise-level analyzer further comprises:
    active speech spectra estimation logic configured to estimate an active speech spectrum of the transformed far-end speech signal using energy levels across Bark bands and previous spectrum levels; and
    speech band selection logic configured to select an active band from the estimated active speech spectrum.

6. The system of claim 5, wherein the determining of selective band boosting guidance is further performed using the selected active band.

7. The system of claim 2, wherein the near-end noise signal preprocessing logic further comprises:
    low-pass filter logic configured to limit the near-end noise signal to frequencies associated with speech;
    microphone response compensation logic configured to adjust the filtered near-end noise signal using information associated with the microphone;
    voice-activity detection logic configured to identify any near-end voice activity in the adjusted near-end noise signal;
    acoustic echo cancellation logic configured to reduce an echo signal captured by the microphone in the voice cancelled near-end noise signal;
    fast Fourier transform logic configured to perform a time-to-frequency transformation of the echo-reduced near-end noise signal; and
    near-end noise auditory masking logic configured to determine a minimum masking threshold (MMT) for the transformed near-end noise signal.

8. The system of claim 1, wherein the noise-level analyzer performs the determining masking across frequency bands of the far-end speech signal by the near-end noise signal by being configured to:
    generate a minimum masking threshold (MMT) of the far-end speech using a psycho-acoustic model;
    generate a MMT of the near-end noise using the psycho-acoustic model;
    compare the far-end speech MMT against the near-end noise MMT using a Bark band-wise comparison; and
    determine masking occurs in Bark bands where the far-end speech MMT is above an auditory threshold and below the near-end noise MMT.

9. The system of claim 1, wherein the noise-level analyzer performs the determining selective band boosting guidance using the masking and the feedback information by being configured to:
- identify for boosting one or more frequency bands in which the far-end speech signal is above an auditory threshold and masked by the near-end noise signal;
- estimate an active speech spectrum by analyzing far-end speech signal energy levels across Bark bands and a history of energy levels of the far-end speech signal; and
- restrict the boosting to the estimated active speech spectrum.

10. The system of claim 9, wherein the noise-level analyzer performs the determining selective band boosting guidance using the masking and the feedback information by being further configured to smooth the band boosting guidance across frames using noise burst information and previous frame band boosting guidance.

11. The system of claim 1, wherein the speaker boost logic circuit further comprises intelligent signal gain selector logic, wherein the intelligent signal gain selector logic is configured to:
- determine minimum gain levels for each Bark band by analyzing the selective band boosting guidance and gain levels from the speaker activity;
- lower the minimum gain levels for selected high Bark bands in response to a determination that the power level of the system is low; and
- lower the minimum gain levels in response to a determination that near-end sound pressure levels are low.

12. The system of claim 11, wherein the intelligent signal gain selector logic is further configured to adjust minimum gain levels using information from a previous speaker output signal.

13. A method for providing audio of far-end speech in the presence of near-end noise using a speaker, the method comprising:
- determining masking across frequency bands of a far-end speech signal by a near-end noise signal;
- determining selective band boosting guidance using the masking determination and feedback information from the speaker; and
- boosting loudness of the far-end speech signal in response to the selective band boosting guidance and information regarding a system comprising the speaker.

14. The method of claim 13, wherein said determining the masking across frequency bands of the far-end speech signal by the near-end noise signal comprises:
- determining a far-end speech minimum masking threshold (MMT);
- determining a near-end noise MMT; and
- comparing the far-end speech MMT with the near-end noise MMT to find masked far-end speech frequency bands where the far-end speech MMT is below the near-end noise MMT.

15. The method of claim 14, wherein said determining the far-end speech MMT comprises:
- filtering the far-end speech signal to limit frequencies of the far-end speech signal to a range associated with human speech;
- performing a time-to-frequency transformation of the filtered far-end speech signal;
- adjusting the transformed far-end speech signal in response to characteristics of the speaker; and
- performing a psychoacoustic analysis on the adjusted far-end speech signal to determine the far-end speech MMT.

16. The method of claim 14, wherein said determining the near-end noise MMT comprises:
- filtering the near-end noise signal to limit frequencies of the near-end noise signal to a range associated with human speech;
- adjusting the filtered near-end noise signal in response to characteristics of a microphone used to generate the near-end noise signal;
- dropping a near-end noise signal frame having any detected voice-activity;
- performing a time-to-frequency transformation of the adjusted near-end noise signal; and
- performing a psycho-acoustic analysis on the transformed near-end noise signal to determine the near-end noise MMT.

17. The method of claim 16, wherein said determining the near-end noise MMT further comprises performing an acoustic echo cancellation on the near-end noise signal.

18. The method of claim 14, wherein said determining the masking across frequency bands of the far-end speech signal by the near-end noise signal further comprises:
- determining a fundamental frequency of the transformed far-end speech signal;
- identifying tonal maskers using a tonality estimation of the far-end speech signal; and
- identifying those far-end speech frequency bands that are above an auditory threshold using the tonal maskers.

19. The method of claim 18, wherein said determining selective band boosting guidance comprises:
- selecting far-end frequency bands to boost based on those far-end speech frequency bands where the far-end speech MMT is below the near-end noise MMT and the identified far-end speech frequency bands that are above the auditory threshold;
- analyzing far-end speech signal energy levels across Bark bands and a history of energy levels of the far-end speech signal to estimate an active speech spectrum;
- limiting the far-end frequency bands to boost based on the estimated active speech spectrum; and
- smoothing the limited far-end frequency bands to boost in light of a noise burst identification and a previous speaker output signal frame.

20. The method of claim 13, wherein said boosting loudness of the far-end speech signal in response to the selective band boosting guidance and information regarding the system comprising the speaker further comprises:
- determining minimum gain levels for each Bark band by analyzing the selective band boosting guidance and gain levels from the speaker activity;
- adjusting the minimum gain levels for selected high Bark bands in response to determining that the power level of the system is low;
- adjusting the minimum gain levels in response to a determination that near-end sound pressure levels are low; and
- adjusting the minimum gain levels using information from a previous speaker output signal frame.

* * * * *